May 16, 1967 T. P. SMITH 3,320,353

PACKAGED ELECTRONIC DEVICE

Filed Oct. 29, 1963

INVENTOR.
Terry P. Smith
BY Clarence R. Patty, Jr.
ATTORNEY

United States Patent Office 3,320,353

Patented May 16, 1967

3,320,353

PACKAGED ELECTRONIC DEVICE

Terry P. Smith, Corning, N.Y., assignor to Corning Glass Works, Corning, N.Y., a corporation of New York Filed Oct. 29, 1963, Ser. No. 319,830
5 Claims. (Cl. 174—52)

This invention relates to a package for an electronic device and a method of manufacturing thereof. More particularly this invention relates to a method of forming a hermetic seal around gold clad leads, extending through the body of a package for an electronic device, without deleteriously affecting the gold, but is in no way limited to such applications.

Electronic devices such as transistors, diodes, semiconductors, integrated circuits, and the like are commonly sealed in a container or package having a body of electrically insulating material. Such a body is formed with a relatively large planar bottom wall surrounded by a rim defining a cavity within which an electronic element is disposed. Leads extending from within said cavity to the outside of said body are provided. The electronic element is connected to said leads within said cavity and is enclosed therein by a cover plate disposed over the cavity and sealed to said rim or by other suitable means.

The leads for such devices are formed of nickel, nickel-iron and the like metals and alloys, while the package is formed of glass, ceramic or like insulating materials.

The leads may be cleaned, assembled with, and sealed to the package body or may be coated with gold prior to being assembled therewith to prevent oxidation of the leads while they are being sealed to said body. Heretofore known sealing processes involved firing and sealing temperatures which caused gold plate to burn off of said leads during said sealing. To facilitate attachment of said electronic element within said package, by attaching gold, aluminum, or the like whisker wires between said element and said leads, and to prevent corrosion of said leads during use of the package device, the sealed leads would have to be recleaned and plated or replated with gold after sealing thereof to the package body and prior to attachment of said element thereto. Such additional handling, cleaning, and plating or replating greatly increased the cost, provided poorer product selection, and increased the failure rate of the finished device.

It is an object of this invention to provide an electronic package, assembly, and method of manufacture which overcomes the heretofore noted disadvantages.

Another object of this invention is to provide a hermetically sealed electronic device noted by its economy and ease of manufacture.

A further object is to provide a method of hermetically sealing glass to gold coated leads without burning off the gold.

Still another object is to provide a method of manufacture of an electronic package having a minimum hermeticity of $5\times10^{-11}$ cubic centimeters (cc.) of helium per second between the glass body and gold coated leads thereof.

As used herein, the term hermeticity means the quality or state of being impervious to the passage of a stated quantity of helium during a given period of time.

Broadly according to the instant invention a package for an electronic device may be manufactured by providing a quantity of finely divided glass having a sintering temperature of up to 730° C., coating a plurality of metallic leads with an adherent coating of gold having a thickness ranging from about 0.00035 inch to about 0.00065 inch, compacting the powdered glass about said leads to form a body for said package, said body having a relatively large planar bottom wall with a rim at the periphery thereof defining a cavity, said leads extending from within said cavity to the outside of said body, and firing the body so formed at the sintering temperature of said glass to sinter said glass and form a hermetic seal about said leads.

Additional objects, features, and advantages of the present invention will become apparent to those skilled in the art, from the following detailed description and the attached drawing on which, by way of example, only the preferred embodiments of this invention are illustrated.

Figure 1:
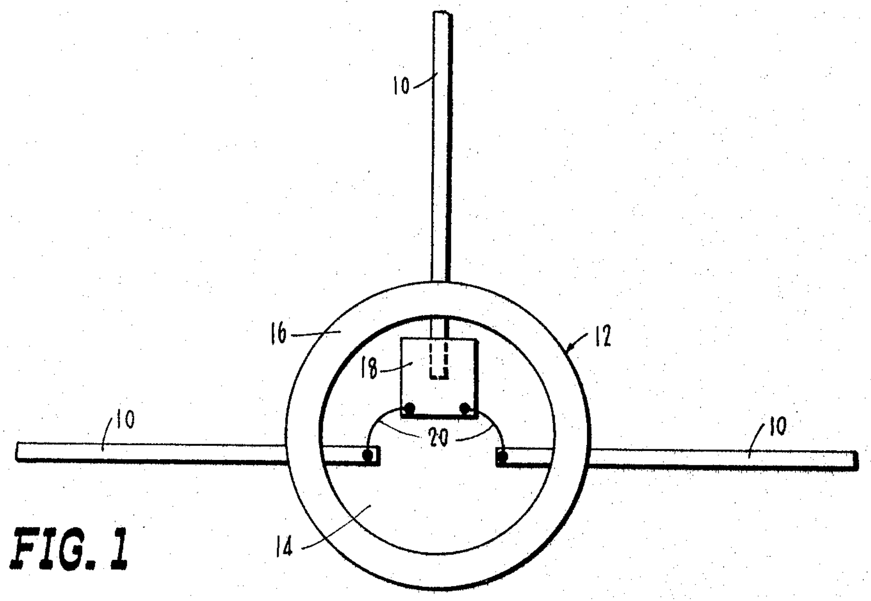
FIG. 1 is a plan view of an electronic device package body with leads and an electronic element in place according to the present invention.
Figure 2:
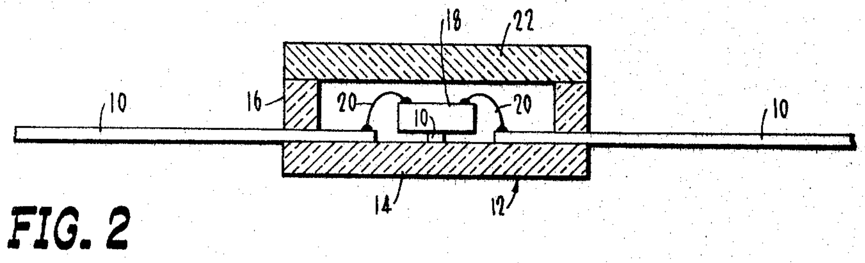
FIG. 2 is a cross sectional elevation of an electronic device package with leads and an electronic element in place according to the present invention.

Referring to FIGS. 1 and 2, leads 10 have a coating of gold, ranging in thickness from about 0.00035 inch to about 0.00065 inch, adhered thereto. Said gold coating is applied by cladding. Said leads have a core formed of nickel, nickel-iron, such as niron or other suitable electronic device lead material. A quantity of finely divided glass having a sintering temperature of up to 730° C. is provided and compacted about said leads 10 in a predetermined shape to form body 12 of an electronic package. Body 12 comprises a relatively large planar bottom wall 14 and a rim 16 at the periphery thereof. For examples of glass compositions suitable for the instant invention, references is made to U.S. patent application, Ser. No. 824,369, now Patent No. 3,169,217, entitled, "Opaque Glass and Semiconductive Device Made Therefrom," filed July, 1, 1959 by Robert H. Dalton. A glass suitable for the present purposes may be one having a composition in weight percent consisting essentially of 0–15% $Na_2O$, 0–20% $K_2O$, the total of said $Na_2O$ and $K_2O$ being 12–20%, 1–10% CaO, 0–10% MgO, the total of said CaO and MgO being 1–10%, 0–5% $Al_2O_3$, 2–5% cobalt oxide computed as $Co_3O_4$, 2–10% iron oxide computed as $Fe_2O_3$, 0.2–1.1% reduced sulphur computed as free sulphur, up to 3% reduced carbon computed as free carbon, and 65–76% $SiO_2$. The present invention, however, is not limited to such glasses.

The body so formed, with the gold clad leads embedded therein, is fired at the sintering temperature of the glass whereby the body becomes impervious to moisture. By forming body 12 by sintering rather than by moulding molten or softened glass about the leads, a temperature of about 70° C. lower may be used. Accordingly, the gold cladding is substantially unaffected by the sintering temperature, and an electronic element 18 may be placed into the cavity within body 12 and be immediately attached to said leads by suitable means, such as whisker wires 20, without any further treatment of leads 10.

Furthermore, it is found that by sintering body 12 an excellent hermetic seal is obtained about the leads with the glass strongly adhering to the leads. A cover 22 may then be placed over said cavity in body 12 and sealed to rim 16 by any of various methods well known in the art. Such methods generally employ much lower temperature than are required for forming a hermetic seal between the leads and the body to prevent deleterious effects on the electronic element itself.

It has been found that powdered glass having a sintering temperature of not over 730° C. is suitable for the purposes of this invention. Temperatures above 730° C. start to cause deterioration and burn off of the gold coating on the leads. Also, at temperatures above 730° C., the gold to metal seal tends to crack and check.

It has also been found that gold coatings of less than about 0.00035 inch in thickness do not provide adequate protection against oxidation of the base material of the leads during the sintering process. On the other hand, the sintered glass body does not adhere well to gold coatings having a thickness in excess of about 0.00065 inch thereby resulting in a poor hermetic seal.

A typical example of carrying out the present invention is as follows. Referring to FIG. 2, a plurality of leads 10 is formed of a commercial alloy comprising 50% nickel and 50% iron. Said leads are then clad with commercial quality 24 karat gold having a thickness of about 0.0005 inch. A package body 12 is formed in a desired shape by compacting a quantity of glass powder, having a mesh of between 50 and 200, about the gold clad leads. The glass powder is of a composition as illustrated in Example 1 of the heretofore noted Dalton application. The body so formed is then fired at a temperature of 660° C. for a period of 13 minutes, whereupon the glass particles are caused to sinter. An electronic element 18, such as a transistor chip, is then placed in the cavity within the package body, and is connected to leads 10 by means of whisker wires 20. A cover 22 is then sealed to body 12 about rim 16 thereof.

An electronic package formed according to the above had a hermeticity in excess of $5 \times 10^{-11}$ cc. of helium per second. Neither the gold cladding nor the lead base metal is in any way deleteriously affected or oxidized during the fabricating process.

Figure 3:
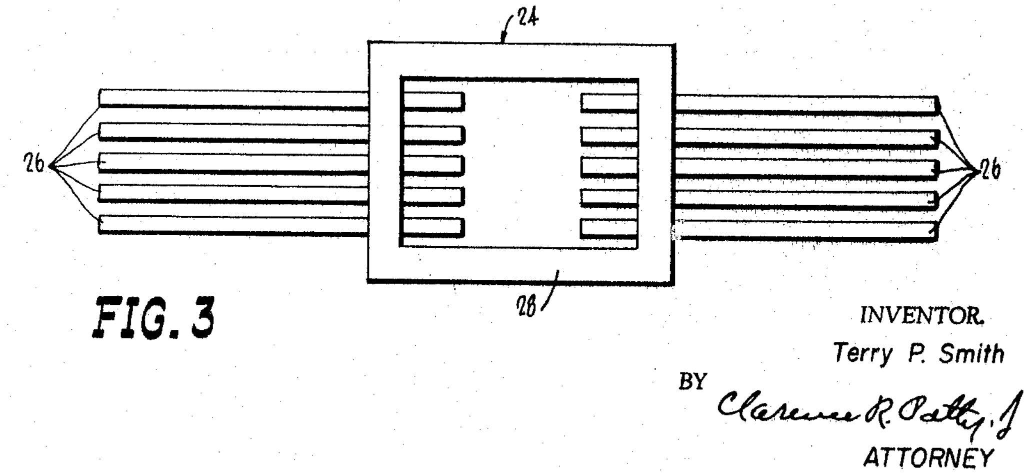
FIG. 3 is a plan view of an electronic device package formed in accordance with the present invention.

Referring to FIG. 3 another embodiment of this invention is illustrated. A body 24 is formed in a rectangular shape by the method hereinabove described. A plurality of gold clad leads 26 are extended from opposite sides of the body through rim 28 into the cavity formed thereby. Said body may also be formed with said leads extending from any of the sides thereof.

It should be noted that the body of the package of this invention may be formed with a pad or base disposed within the cavity, upon which an electronic device may be mounted. Such a pad or base is generally a thin flat electrically conductive member adhered to the planar bottom wall and connected to at least one of the leads.

Although the present invention has been described with respect to specific details of certain embodiments thereof, it is not intended that such details be limitations upon the scope of the invention except insofar as set forth in the following claims.

I claim:

1. An article of manufacture comprising,
   (a) a metallic member having an adherent cladding of gold applied thereto, said gold having a thickness ranging from about 0.00035 inch to about 0.00065 inch, and
   (b) a body of sintered glass particles formed about said member and adhered thereto to form a seal therebetween, said glass having a sintering temperature of up to 730° C.

2. A package for an electronic device comprising,
   (a) a body of sintered glass particles having a cavity therein suitable for receiving an electronic device, and (b) a plurality of gold clad metallic leads having a gold thickness ranging from about 0.00035 inch to about 0.00065 inch, sealed to said body and extending from within said cavity to the outside of said body.

3. An electronic device comprising,
   (a) a body of sintered glass particles having a cavity therein suitable for receiving an electronic device, said glass having a sintering temperature of up to 730° C.,
   (b) a plurality of gold clad metallic leads having a gold thickness ranging from about 0.00035 inch to 0.00065 inch sealed to said body and extending from within said cavity to the outside of said body,
   (c) an electronic element disposed within said cavity connected to said leads, and
   (d) a cover disposed over said cavity sealed to said body to enclose said element.

4. A package for an electronic device comprising,
   (a) a body of sintered glass particles, said glass consisting essentially by weight of 0–15% $Na_2O$, 0–20% $K_2O$, the total of said $Na_2O$ and $K_2O$ being 12–20%, 1–10% CaO, 0–10% MgO, the total of said CaO and Mgo being 1–10%, 0–5% $Al_2O_3$, 2–5% cobalt oxide computed as $Co_3O_4$, 2–10% iron oxide computed as $Fe_2O_3$, 0.2–1.1% reduced sulphur computed as free sulphur, up to 3% reduced carbon computed as free carbon, and 65–76% $SiO_2$, said body having a cavity therein suitable for receiving an electronic element, and
   (b) a plurality of gold clad metallic leads having a gold thickness ranging from about 0.00035 inch to about 0.00065 inch sealed to said body and extending from within said cavity to the outside of said body.

5. An article of manufacture comprising,
   (a) a gold clad metallic member having a gold thickness ranging from about 0.00035 inch to about 0.00065 inch,
   (b) a body of sintered glass particles having a sintering temperature up to 730° C., formed about said member, and
   (c) a seal between said member and said body having hermeticity of at least $5 \times 10^{-11}$ cubic centimeters of helium per second.

References Cited by the Examiner

UNITED STATES PATENTS

| | | | |
|---|---|---|---|
| 2,272,747 | 2/1942 | Hull et al. | |
| 2,555,877 | 6/1951 | Doran. | |
| 3,020,456 | 2/1962 | Layton et al. | 161—196 X |
| 3,029,559 | 4/1962 | Treptow | 65—43 X |
| 3,114,863 | 12/1963 | Dalton | 174—50.5 X |
| 3,139,678 | 7/1964 | Anthony et al. | |
| 3,169,217 | 2/1965 | Dalton. | |
| 3,189,677 | 6/1965 | Anthony et al. | 174—50.61 |
| 3,213,337 | 10/1965 | Long. | |

OTHER REFERENCES

"Microelectronics," published June 26, 1963, pp. 299.

LEWIS H. MYERS, *Primary Examiner.*

J. F. BURNS, *Examiner.*

D. L. CLAY, W. B. FREDRICKS, *Assistant Examiners.*